United States Patent [19]

Kirkpatrick et al.

[11] 4,099,261
[45] Jul. 4, 1978

[54] METHOD FOR WRITING ON ARCHIVAL MEMORY TARGET BY ION DAMAGE

[75] Inventors: Conilee G. Kirkpatrick; George E. Possin, both of Schenectady, N.Y.

[73] Assignee: General Electric Company, Schenectady, N.Y.

[21] Appl. No.: 770,698

[22] Filed: Feb. 22, 1977

[51] Int. Cl.² .................................... G11C 13/00
[52] U.S. Cl. .................. 365/105; 315/84.5; 328/123; 365/128
[58] Field of Search .... 340/173 R, 173 CR, 173 LM; 315/84.5; 328/123; 365/103, 105 D, 128 X

[56] References Cited

U.S. PATENT DOCUMENTS

| 3,362,017 | 1/1968 | Brahm | 340/173 CR |
| 3,763,476 | 10/1973 | Wilson | 340/173 CR |
| 3,879,714 | 4/1975 | Veith | 340/173 CR |

*Primary Examiner*—Terrell W. Fears
*Attorney, Agent, or Firm*—Geoffrey H. Krauss; Joseph T. Cohen; Marvin Snyder

[57] ABSTRACT

A method for storing data in an archival memory semiconductor target by inducing damage to the semiconductor lattice at selected ones of a plurality of storage sites arranged as a two-dimensional array upon a surface of the target. Ions are accelerated and collimated as a beam to impinge upon a target surface to induce the damage to a controlled depth, whereby subsequent illumination of a damaged data site by an electron beam will allow the beam-produced electron-hole pairs to recombine within the damaged area to prevent increased current flow and read a binary zero bit, while hole migrations through a target depletion region will cause increased current flow, at an undamaged data site, to indicate a binary one data bit.

12 Claims, 2 Drawing Figures

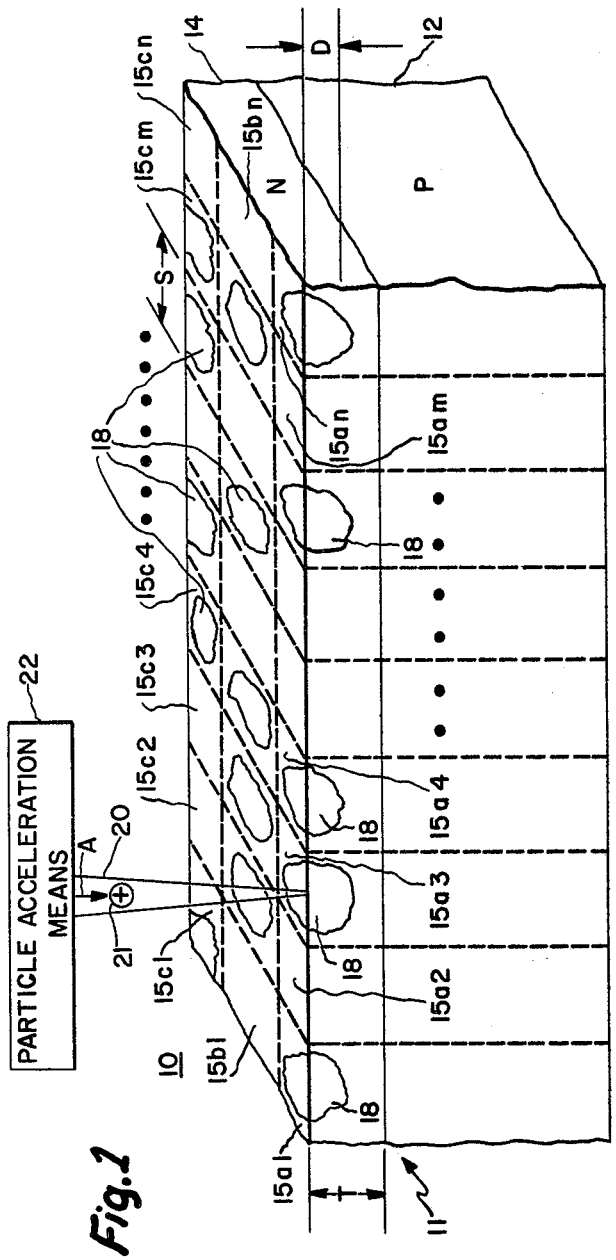
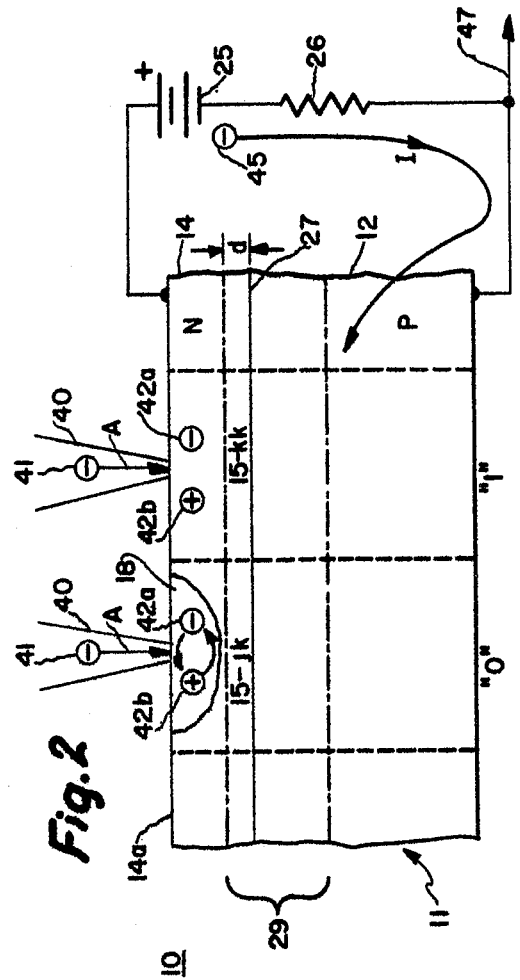
Fig.1
Fig.2

METHOD FOR WRITING ON ARCHIVAL MEMORY TARGET BY ION DAMAGE

The invention herein described was made in the course of or under a contract or subcontract thereunder, with the Department of the Air Force.

BACKGROUND OF THE INVENTION

The present invention relates to methods of storing data and, more particularly, to a novel method for storing data in an archival memory semiconductor target by means of inducing damage in the semiconductor lattice.

Archival memory media, exhibiting a read-only structure, is often required for storing large amounts of data, on the order of $10^{15}$ bits per device. Several methods have been proposed for writing binary data into small storage sites, having center-to-center spacings on the order of microns, to facilitate the necessary data packing densities. The fabrication methods hitherto suggested all require implantation of dopants to form diodes in a layer of a first semiconductor polarity-type fabricated upon a substrate of the remaining polarity-type semiconductor, whereby greater or lesser amount of carriers are caused to flow across a depletion region formed when a junction between two semiconductor layers is reversed biased. These methods require that the energized dose of implanted ions be relatively precisely controlled to achieve the desired variation in target current with changes in local carrier recombination at a bit of stored data. Alternative methods for storing data in the fabricated layer of a target medium, resulting in high local carrier combination and very short minority carrier lifetime, are thus desirable.

BRIEF SUMMARY OF THE INVENTION

In accordance with the invention, a method for storing data in a semiconductor archival memory target by ion damage includes the steps of providing a substrate of a first polarity-type semiconductor; fabricating a layer of the remaining polarity-type semiconductor thereupon, with the surface of the fabricated layer being assigned as a two-dimensional array of potential data storage sites; and damaging a portion of each data storage site at which a first value of binary information is to be stored. The undamaged data storage sites store the remaining value of binary information.

In one preferred embodiment, the fabricated layer lattice is damaged by means of a fluence of ions accelerated to impinge upon the target surface in a finely collimated beam. Data is read from the target by reverse biasing the junction between the opposite-polarity-type layers and causing a collimated beam of electrons to impinge sequentially upon each data site, whereby local recombination within the damaged data site portion prevents additional current flow across the depletion region while electron-beam-produced electron-hole pairs are split and migrate in opposite directions to cause additional current flow through the depletion region at those data sites devoid of a damaged region.

Accordingly, it is an object of the present invention to provide a novel method for writing data into an archival memory target by means of ion damage.

This and other objects of the present invention will become apparent upon a consideration of the following detailed description and the associated drawings.

BRIEF DESCRIPTION OF THE DRAWINGS

FIG. 1 is a section perspective view of an archival memory target during writing of data therein by ion damage methods; and FIG. 2 is a sectional view of a portion of the damaged target of FIG. 1, during the reading of data therefrom and useful in understanding the principles of the present invention.

DETAILED DESCRIPTION OF THE INVENTION

Referring initially to FIG. 1, an archival memory target 10 comprises a target plane 11 preferably fabricated of a substrate layer 12 of a semiconductor material having a first type of impurities, e.g. P-type silicon, upon which is fabricated, to a thickness T preferably on the order of 0.1 microns, a layer 14 of the same semiconductor material having the opposite polarity-type impurities, e.g. N-type silicon. The upper surface 14a of fabricated semiconductor layer 14 is established as a two-dimensional array of substantially square locations 15 at which each of a plurality of data bits may be stored. Thus, surface 14a may be considered as an array comprised of a plurality of sites 15-a1 through 15-nn, having a 15-jk-th site lying in the j-th row (horizontally-disposed as seen in FIG. 1) and in the k-th column (obliquely-disposed in FIG. 1). Each of sites 15 may have a region 18 of damage induced in the semiconductor lattice thereof, with damaged regions 18 preferably causing storage of a binary zero bit of data and a binary one bit of data being stored in each of those sites, e.g. 15-a2, 15-b1, etc. devoid of damage.

Each of damaged regions 18 is induced, to a depth D less than fabricated layer thickness T, by means of a beam 20 of ions 21 accelerated and formed by a particle acceleration means 22. It should be understood that, while positive ions 21 are preferred, negative ions may be utilized, and unionized neutral particles could be equally as well utilized to induce regions 18 of lattice damage, if suitable means 22 are available for emitting a narrow beam 20 of the neutral particles at the required energy. As each site 15 preferably has side dimensions S on the order of microns, whereby bit-to-bit damage regions have a center to center spacing sufficient to pack on the order of $10^{12}$ bits/cm$^2$, particles 21 are preferably ionized whereby the required finely focussed and collimated beam 20, having a diameter on the order of 0.1 microns at surface 14a, is achieved. Beam 20 is caused to impinge substantially perpendicular to layer surface 14a, substantially at the center of that one of the array of sites 15 to be written with a damaged region 18 to store a binary zero data bit thereat.

Ions of material such as helium (He), xenon (Xe), argon (Ar), boron (B) and arsenic (As) have all been utilized, although others of the noble gasses and, indeed, any other element or molecule (such as BF$_2$ and the like), can be utilized. Fluences on the order of $10^{10}$ to $10^{13}$ ions/cm$^2$ and acceleration energies in the region of 30–100 KeV. have proven satisfactory to produce damage regions having depths D on the order of 0.1 microns. In one particular example, a planar diode target 11, was fabricated from <111> P-type silicon, having a resistivity on the order of 15 ohm-cm. was damaged by selective exposure to He$^+$ ions in a beam having a 30 KeV. energy at room temperature. The beam was directed at about 7° off the crystalline axis at a fluence of about $10^{13}$ ions per cm..

In operation, particle acceleration means 22 is caused to move parallel to target surface 14a and beam 20 is modulated between its "on" and "off" conditions responsive to the presence of binary one and binary zero bits, respectively, of a data pattern to be stored. As acceleration means 22 passes over a site, e.g., 15-a2, at which a binary one is to be stored, the beam is modulated to its "off" condition, whereby a data site is not damaged. The acceleration means continues its motion relative to the target surface until the beam axis is centered substantially over the center of the next array site, e.g., 15-a3; storage of a binary zero at this next site is facilitated by gating the beam to its "on" condition whereby the required fluence of ions 21 are accelerated into the fabricated layer 14 to form damage region 18. In this manner, each of the damaged and nondamaged sites are recorded as the acceleration means scans along a row, e.g., 15-ax ($1 \leq x \leq n$) and thence along each subsequent row, e.g., 15-bx, 15-cx, ..., 15-nx, until the entire two-dimensional array has been scanned. It should be understood that the damaged sites are permanently written binary zeroes, and that any undamaged (binary one) site can be subsequently modified to the damaged, or binary zero, condition, but a single previously damaged site cannot be selectively "erased" and rewritten as a site containing a binary one bit of data, although the entire target plane can be "erased" by annealing and the like processes which remove all damaged sites.

Referring now to FIG. 2, wherein like reference designations are utilized for like elements, an enlarged sectional view of the target plane shows a damage region 18, corresponding to a binary zero bit, written at the 15-jk-th site and an undamaged region located at the adjacent 15-kk-th site. The binary data is read by first coupling a potential source 25 in series with a load resistance 26 betweeen the N-type layer 14 and the P-type layer 12 to reverse bias the junction 27 therebetween and form a depletion region 29. The doping concentrations in the N- and P-type layers 14 and 12, respectively, are such that depletion region 29 extends a greater distance into the P-type layer and only extends a short distance $d$ into the N-type layer where distance $d$ is less than the remaining thickness (T-D) of the undamaged portion of the layer beneath damaged portion 18, to prevent depletion region 29 from contacting damage region 18.

Prior to data read-out, the load current I (drawn from the negative terminal of source 25, through output resistance 26 and into the P-type semiconductor layer) is substantially established by the leakage current across the reversed-biased depletion region.

A beam 40 of electrons 41 is finely focussed and collimated to sequentially impinge upon target top surface 14a substantially at the center of each data site 15-jk and 15-kk. The incident electron beam causes formation of pairs of electrons 42a and holes 42b, with substantially similar spatial-depth distribution (in the direction of arrow A) in each storage site, whether or not containing a damaged portion 18. In one preferred embodiment, the beam electrons are accelerated to an average energy of 2 KeV.

In a data site 15 having a damaged portion 18, e.g., site 15-jk, electrons 42a and holes 42b tend to be captured within the damaged region whereby electron-hole recombination occurs essentially only in the damaged region. Thus, holes 42b do not migrate into, or across, depletion region 29 and do not recombine with electrons supplied by source 25, whereby the magnitude of output current I remains essentially at its leakage current value.

When the source (not shown for purposes of simplicity) of electron beam 40 is scanned to another data site, e.g. 15-kk, which site is devoid of a damaged portion 18, the electrons of the beam produce pairs of electrons 42a and holes 42b, as at the damaged site, but holes 42b do not encounter the recombination centers of the damaged lattice and tend to migrate to depletion region 29 and undergo recombination with electrons 45 furnished by source 25. A greater magnitude of output current I is caused to flow through output resistance 26 and into the P-type layer 12 of the target, producing a current gain on the order of 500 times for a 2.5 KeV. electron beam. The change in current across output resistance 26 causes a change in the voltage at the target output lead 47, which change may be detected by known means to indicate the presence of a binary one bit being stored at the storage site having an undamaged top layer 14. The electrons 42b of the electron-hole pair simultaneously migrate to the positive terminal of source 25, which terminal is deficient in electrons. Hence, the beam-produced electron-hole pairs are prevented from recombination by travel in substantially opposite directions in the fabricated top layer 14.

It should be understood that, while the preferred embodiment utilizes a fabricated thin layer of N-type material upon a substrate of P-type material, the doping polarities may be reversed; other semiconductor materials, such as germanium and the like, may be utilized as well as the preferred silicon semiconductor; and other ion species, such as positive ions of Neon (Ne), Krypton (Kr), Nitrogen (N) and the like, may be used to damage the fabricated layer and write a binary zero into storage at the chosen data site.

While our present invention has been described with reference to one preferred embodiment thereof, many variations and modifications will now become apparent to those skilled in art. It is our intent, therefore, to be limited not by the present disclosure herein, but only by the scope of the appending claims.

What is claimed is:

1. A method for essentially permanently storing binary data in an archival memory semiconductor target, comprising the steps of:
   (a) providing a substrate of a semiconductor material having a first polarity type, said substrate having a surface;
   (b) fabricating a layer of the remaining polarity type of the semiconductor material upon and substantially completely across the surface of said substrate;
   (c) assigning a two-dimensional array of potential data storage sites upon a surface of the fabricated layer furthest from said substrate surface;
   (d) damaging the lattice of the semiconductor layer over a portion of each data storage site at which a first value of binary information is to be stored; and
   (e) maintaining the lattice of the semiconductor layer at the remaining data storage sites in undamaged condition to store a remaining value a binary information.

2. A method as set forth in claim 1, further comprising the step of:
   (f) interrogating sequential ones of a multiplicity of data storage sites to read the value of binary information stored at each of said multiplicity of sites.

3. A method as set forth in claim 2, wherein step (f) comprises the steps of: directing a beam of electrons into the fabricated layer at each of said multiplicity of data sites to generate electron-hole pairs therein; reverse biasing the junction between said substrate and said fabricated layer to create a depletion region thereabout; and monitoring the current caused to flow to said depletion region through said substrate to read the value of binary information stored at the data site upon which the electron beam impinges.

4. A method as set forth in claim 2, further comprising the step of accelerating the electrons to an average energy in the vicinity of about 2 KeV.

5. The method as set forth in claim 1, wherein step (d) comprises the steps of: providing a source of ions; accelerating the ions into a finely collimated beam; scanning the beam of ions sequentially to the surface of said layer at each of the data sites defined on said target; and modulating said beam to impinge only upon said layer surface at each data site at which the first value of binary information is to be stored by inducing damage to the lattice of said fabricated layer thereat.

6. A method as set forth in claim 5, wherein said ions are of a material selected from the group consisting of helium, argon, krypton, xenon, neon, boron, nitrogen and arsenic.

7. A method as set forth in claim 5, wherein the ions are of one of the noble gas elements.

8. A method as set forth in claim 5, wherein the ions are ionized molecules.

9. A method as set forth in claim 5, further comprising a step of establishing the fluence of the beam of ions to be on the order of $10^{10}$ to $10^{13}$ ions per square centimeter.

10. A method as set forth in claim 9, further comprising the step of accelerating the electrons to an energy in the region of 30–100 KeV.

11. A method as set forth in claim 5, further comprising the step of:
(f) interrogating sequential ones of a multiplicity of data storage sites to read the value of binary information stored at each of said multiplicity of sites.

12. A method as set forth in claim 11, wherein step (f) comprises the steps of:
directing a beam of electrons from the same direction as the beam of ions and into the fabricated layer at each of said multiplicity of data sites to generate electron hole pairs therein; reverse biasing the junction between said substrate and said fabricated layer to create a depletion region thereabout; and monitoring the current caused to flow to said depletion region through said substrate to read the value of binary information stored at the data site upon which the electron beam impinges.

* * * * *